United States Patent [19]

Ohta et al.

[11] Patent Number: 5,617,427

[45] Date of Patent: Apr. 1, 1997

[54] METHOD FOR GENERATING TEST SEQUENCES FOR DETECTING FAULTS IN TARGET SCAN LOGICAL BLOCKS

[75] Inventors: Mitsuyasu Ohta, Osaka; Akira Motohara, Hyogo, both of Japan

[73] Assignee: Matsushita Electcric Industrial Co., Ltd., Osaka, Japan

[21] Appl. No.: 544,162

[22] Filed: Oct. 17, 1995

[30] Foreign Application Priority Data

Oct. 18, 1994 [JP] Japan ................... 6-251921

[51] Int. Cl.$^6$ ................... G06F 11/00
[52] U.S. Cl. ................... 371/22.3; 371/27
[58] Field of Search ................... 371/22.3, 22.4, 371/22.5, 22.6, 27

[56] References Cited

U.S. PATENT DOCUMENTS 5,349,587  9/1994  Nadeau-Dostie et al. ............ 371/22.3
5,500,861  3/1996  Oppedahl ............................. 371/22.3
5,504,756  4/1996  Kim et al. ............................ 371/22.3

*Primary Examiner*—Hoa T. Nguyen
*Attorney, Agent, or Firm*—McDermott, Will & Emery

[57] ABSTRACT

This invention is intended for a semiconductor integrated circuit with scan logical blocks wherein scan flip-flops are used for interblock signal communication. A testing sequence is generated to detect a fault in a target scan logical block. First, a block testing sequence, which is a testing sequence to the scan logical block as a single circuit, is generated. If signal inversion occurs in a scan chain that runs through the scan logical block, data that is inputted to or outputted from the scan logical block via such a scan chain is inverted. Patterns equal in number to the semiconductor integrated circuit's structure are placed in front of and behind a shift-in pattern and a shift-out pattern in the block testing sequence, to convert the block testing sequence into a testing sequence for the entire semiconductor integrated circuit. Upon completion of all the testing sequence generation with respect to the scan logical blocks, the generated testing sequences are merged.

7 Claims, 26 Drawing Sheets

FIG.3

| Time | CLK | NT | IN | B_SI | SI2 | B_SO | SO2 | |
|---|---|---|---|---|---|---|---|---|
| 0 | 0 | 1 | X | X | X | X | X | ⎫ |
| 1 | 1 | 1 | X | X | X | X | X | ⎬ Shift In |
| 2 | 0 | 1 | X | 1 | 1 | X | X | |
| 3 | 1 | 1 | X | 1 | 1 | X | X | ⎭ |
| 4 | 0 | 0 | 1 | X | X | X | X | |
| 5 | 1 | 0 | 1 | X | X | X | X | |
| 6 | 0 | 0 | X | X | X | X | X | |
| 7 | 1 | 0 | X | X | X | X | X | |
| 8 | 0 | 1 | X | X | X | H | X | ⎫ |
| 9 | 1 | 1 | X | X | X | X | X | ⎬ Shift Out |
| 10 | 0 | 1 | X | X | X | X | X | |
| 11 | 1 | 1 | X | X | X | X | X | ⎭ |

FIG.4

| Time | CLK | NT | IN | B_SI | SI2 | B_SO | SO2 |
|------|-----|----|----|------|-----|------|-----|
| 0 | 0 | 1 | X | X | X | X | X |
| 1 | 1 | 1 | X | X | X | X | X |
| 2 | 0 | 1 | X | X | X | X | X |
| 3 | 1 | 1 | X | X | X | X | X |
| 4 | 0 | 1 | X | 1 | X | X | X |
| 5 | 1 | 1 | X | 1 | X | X | X |
| 6 | 0 | 1 | X | X | X | X | X |
| 7 | 1 | 1 | X | X | X | X | X |
| 8 | 0 | 1 | X | X | 1 | X | X |
| 9 | 1 | 1 | X | X | 1 | X | X |
| 10 | 0 | 0 | 1 | X | X | X | X |
| 11 | 1 | 0 | 1 | X | X | X | X |
| 12 | 0 | 0 | X | X | X | X | X |
| 13 | 1 | 0 | X | X | X | X | X |
| 14 | 0 | 1 | X | X | X | H | X |
| 15 | 1 | 1 | X | X | X | X | X |
| 16 | 0 | 1 | X | X | X | X | X |
| 17 | 1 | 1 | X | X | X | X | X |

FIG.5

| Time | CLK | NT | IN | B_SI | SI2 | B_SO | SO2 |
|---|---|---|---|---|---|---|---|
| 0 | 0 | 1 | X | X | X | X | X |
| 1 | 1 | 1 | X | X | X | X | X |
| 2 | 0 | 1 | X | X | X | X | X |
| 3 | 1 | 1 | X | X | X | X | X |
| 4 | 0 | 1 | X | 1 | X | X | X |
| 5 | 1 | 1 | X | 1 | X | X | X |
| 6 | 0 | 1 | X | X | X | X | X |
| 7 | 1 | 1 | X | X | X | X | X |
| 8 | 0 | 1 | X | X | 1 | X | X |
| 9 | 1 | 1 | X | X | 1 | X | X |
| 10 | 0 | 0 | 1 | X | X | X | X |
| 11 | 1 | 0 | 1 | X | X | X | X |
| 12 | 0 | 0 | X | X | X | X | X |
| 13 | 1 | 0 | X | X | X | X | X |
| 14 | 0 | 1 | X | X | X | X | X |
| 15 | 1 | 1 | X | X | X | X | X |
| 16 | 0 | 1 | X | X | X | H | X |
| 17 | 1 | 1 | X | X | X | X | X |
| 18 | 0 | 1 | X | X | X | X | X |
| 19 | 1 | 1 | X | X | X | X | X |
| 20 | 0 | 1 | X | X | X | X | X |
| 21 | 1 | 1 | X | X | X | X | X |
| 22 | 0 | 1 | X | X | X | X | X |
| 23 | 1 | 1 | X | X | X | X | X |

FIG.8

| Time | CLK | NT | IN | B_SI | SI2 | B_SO | SO2 |     |
|------|-----|----|----|------|-----|------|-----|-----|
| 0    | 0   | 1  | X  | X    | X   | X    | X   | ⎫   |
| 1    | 1   | 1  | X  | X    | X   | X    | X   |     |
| 2    | 0   | 1  | X  | 0    | 1   | X    | X   | ⎬ Shift In |
| 3    | 1   | 1  | X  | 0    | 1   | X    | X   | ⎭   |
| 4    | 0   | 0  | 1  | X    | X   | X    | X   |     |
| 5    | 1   | 0  | 1  | X    | X   | X    | X   |     |
| 6    | 0   | 0  | X  | X    | X   | X    | X   |     |
| 7    | 1   | 0  | X  | X    | X   | X    | X   |     |
| 8    | 0   | 1  | X  | X    | X   | H    | X   | ⎫   |
| 9    | 1   | 1  | X  | X    | X   | X    | X   |     |
| 10   | 0   | 1  | X  | X    | X   | X    | X   | ⎬ Shift Out |
| 11   | 1   | 1  | X  | X    | X   | X    | X   | ⎭   |

FIG.9

| Time | CLK | NT | IN | B_SI | SI2 | B_SO | SO2 | |
|------|-----|----|----|------|-----|------|-----|---|
| 0 | 0 | 1 | X | X | X | X | X | |
| 1 | 1 | 1 | X | X | X | X | X | Shift In |
| 2 | 0 | 1 | X | 0 | 1 | X | X | |
| 3 | 1 | 1 | X | 0 | 1 | X | X | |
| 4 | 0 | 0 | 1 | X | X | X | X | |
| 5 | 1 | 0 | 1 | X | X | X | X | |
| 6 | 0 | 0 | X | X | X | X | X | |
| 7 | 1 | 0 | X | X | X | X | X | |
| 8 | 0 | 1 | X | X | X | L | X | |
| 9 | 1 | 1 | X | X | X | X | X | Shift Out |
| 10 | 0 | 1 | X | X | X | X | X | |
| 11 | 1 | 1 | X | X | X | X | X | |

FIG.10

| Time | CLK | NT | IN | B_SI | SI2 | B_SO | SO2 |
|------|-----|----|----|------|-----|------|-----|
| 0 | 0 | 1 | X | X | X | X | X |
| 1 | 1 | 1 | X | X | X | X | X |
| 2 | 0 | 1 | X | X | X | X | X |
| 3 | 1 | 1 | X | X | X | X | X |
| 4 | 0 | 1 | X | 0 | X | X | X |
| 5 | 1 | 1 | X | 0 | X | X | X |
| 6 | 0 | 1 | X | X | X | X | X |
| 7 | 1 | 1 | X | X | X | X | X |
| 8 | 0 | 1 | X | X | 1 | X | X |
| 9 | 1 | 1 | X | X | 1 | X | X |
| 10 | 0 | 0 | 1 | X | X | X | X |
| 11 | 1 | 0 | 1 | X | X | X | X |
| 12 | 0 | 0 | X | X | X | X | X |
| 13 | 1 | 0 | X | X | X | X | X |
| 14 | 0 | 1 | X | X | X | X | X |
| 15 | 1 | 1 | X | X | X | X | X |
| 16 | 0 | 1 | X | X | X | L | X |
| 17 | 1 | 1 | X | X | X | X | X |
| 18 | 0 | 1 | X | X | X | X | X |
| 19 | 1 | 1 | X | X | X | X | X |
| 20 | 0 | 1 | X | X | X | X | X |
| 21 | 1 | 1 | X | X | X | X | X |
| 22 | 0 | 1 | X | X | X | X | X |
| 23 | 1 | 1 | X | X | X | X | X |

FIG.14

| Time | CLK | NT | SI2 | B_SI | B_SO | SO2 | |
|---|---|---|---|---|---|---|---|
| 0 | 0 | 1 | X | X | X | X | ⎫ |
| 1 | 1 | 1 | X | X | X | X | ⎬ Shift In |
| 2 | 0 | 1 | 1 | 1 | X | X | |
| 3 | 1 | 1 | 1 | 1 | X | X | ⎭ |
| 4 | 0 | 0 | X | X | X | X | |
| 5 | 1 | 0 | X | X | X | X | |
| 6 | 0 | 1 | X | X | L | X | ⎫ |
| 7 | 1 | 1 | X | X | X | X | ⎬ Shift Out |
| 8 | 0 | 1 | X | X | X | X | |
| 9 | 1 | 1 | X | X | X | X | ⎭ |

FIG.15

| Time | CLK | NT | SI2 | B_SI | B_SO | SO2 |
|------|-----|----|----|------|------|-----|
| 0 | 0 | 1 | X | X | X | X |
| 1 | 1 | 1 | X | X | X | X |
| 2 | 0 | 1 | 1 | 0 | X | X |
| 3 | 1 | 1 | 1 | 0 | X | X |
| 4 | 0 | 0 | X | X | X | X |
| 5 | 1 | 0 | X | X | X | X |
| 6 | 0 | 1 | X | X | L | X |
| 7 | 1 | 1 | X | X | X | X |
| 8 | 0 | 1 | X | X | X | X |
| 9 | 1 | 1 | X | X | X | X |

Rows 0–3: Shift In
Rows 6–9: Shift Out

FIG.16

| Time | CLK | NT | SI2 | B_SI | B_SO | SO2 | |
|---|---|---|---|---|---|---|---|
| 0 | 0 | 1 | X | X | X | X | ⎫ |
| 1 | 1 | 1 | X | X | X | X | ⎬ Shift In |
| 2 | 0 | 1 | 1 | 0 | X | X | |
| 3 | 1 | 1 | 1 | 0 | X | X | ⎭ |
| 4 | 0 | 0 | X | X | X | X | |
| 5 | 1 | 0 | X | X | X | X | |
| 6 | 0 | 1 | X | X | H | X | ⎫ |
| 7 | 1 | 1 | X | X | X | X | ⎬ Shift Out |
| 8 | 0 | 1 | X | X | X | X | |
| 9 | 1 | 1 | X | X | X | X | ⎭ |

FIG.17

| Time | CLK | NT | SI2 | B_SI | B_SO | SO2 |
|---|---|---|---|---|---|---|
| 0 | 0 | 1 | X | X | X | X |
| 1 | 1 | 1 | X | X | X | X |
| 2 | 0 | 1 | X | X | X | X |
| 3 | 1 | 1 | X | X | X | X |
| 4 | 0 | 1 | X | 0 | X | X |
| 5 | 1 | 1 | X | 0 | X | X |
| 6 | 0 | 1 | X | X | X | X |
| 7 | 1 | 1 | X | X | X | X |
| 8 | 0 | 1 | 1 | X | X | X |
| 9 | 1 | 1 | 1 | X | X | X |
| 10 | 0 | 0 | X | X | X | X |
| 11 | 1 | 0 | X | X | X | X |
| 12 | 0 | 1 | X | X | H | X |
| 13 | 1 | 1 | X | X | X | X |
| 14 | 0 | 1 | X | X | X | X |
| 15 | 1 | 1 | X | X | X | X |

FIG.18

| Time | CLK | NT | SI2 | B_SI | B_SO | SO2 |
|------|-----|----|----|------|------|-----|
| 0  | 0 | 1 | X | X | X | X |
| 1  | 1 | 1 | X | X | X | X |
| 2  | 0 | 1 | X | X | X | X |
| 3  | 1 | 1 | X | X | X | X |
| 4  | 0 | 1 | X | 0 | X | X |
| 5  | 1 | 1 | X | 0 | X | X |
| 6  | 0 | 1 | X | X | X | X |
| 7  | 1 | 1 | X | X | X | X |
| 8  | 0 | 1 | 1 | X | X | X |
| 9  | 1 | 1 | 1 | X | X | X |
| 10 | 0 | 0 | X | X | X | X |
| 11 | 1 | 0 | X | X | X | X |
| 12 | 0 | 1 | X | X | X | X |
| 13 | 1 | 1 | X | X | X | X |
| 14 | 0 | 1 | X | X | H | X |
| 15 | 1 | 1 | X | X | X | X |
| 16 | 0 | 1 | X | X | X | X |
| 17 | 1 | 1 | X | X | X | X |
| 18 | 0 | 1 | X | X | X | X |
| 19 | 1 | 1 | X | X | X | X |
| 20 | 0 | 1 | X | X | X | X |
| 21 | 1 | 1 | X | X | X | X |

FIG.19

| Time | CLK | NT | SI1 | B_SI |
|---|---|---|---|---|
| 0 | 0 | 1 | X | X |
| 1 | 1 | 1 | X | X |
| 2 | 0 | 1 | 1 | X |
| 3 | 1 | 1 | 1 | X |
| 4 | 0 | 0 | X | X |
| 5 | 1 | 0 | X | X |
| 6 | 0 | 1 | X | L |
| 7 | 1 | 1 | X | X |
| 8 | 0 | 1 | X | X |
| 9 | 1 | 1 | X | X |

Rows 0–3: Shift In
Rows 6–9: Shift Out

FIG.20

| Time | CLK | NT | SI1 | B_SI |
|---|---|---|---|---|
| 0 | 0 | 1 | X | X |
| 1 | 1 | 1 | X | X |
| 2 | 0 | 1 | 1 | X |
| 3 | 1 | 1 | 1 | X |
| 4 | 0 | 0 | X | X |
| 5 | 1 | 0 | X | X |
| 6 | 0 | 1 | X | H |
| 7 | 1 | 1 | X | X |
| 8 | 0 | 1 | X | X |
| 9 | 1 | 1 | X | X |

Rows 0–3: Shift In
Rows 6–9: Shift Out

FIG. 21

| Time | CLK | NT | SI1 | B_SI |
|------|-----|----|----|------|
| 0 | 0 | 1 | X | X |
| 1 | 1 | 1 | X | X |
| 2 | 0 | 1 | X | X |
| 3 | 1 | 1 | X | X |
| 4 | 0 | 1 | X | X |
| 5 | 1 | 1 | X | X |
| 6 | 0 | 1 | X | X |
| 7 | 1 | 1 | X | X |
| 8 | 0 | 1 | 1 | X |
| 9 | 1 | 1 | 1 | X |
| 10 | 0 | 0 | X | X |
| 11 | 1 | 0 | X | X |
| 12 | 0 | 1 | X | H |
| 13 | 1 | 1 | X | X |
| 14 | 0 | 1 | X | X |
| 15 | 1 | 1 | X | X |

FIG. 22

| Time | CLK | NT | SI1 | B_SI |
|------|-----|----|----|------|
| 0 | 0 | 1 | X | X |
| 1 | 1 | 1 | X | X |
| 2 | 0 | 1 | X | X |
| 3 | 1 | 1 | X | X |
| 4 | 0 | 1 | X | X |
| 5 | 1 | 1 | X | X |
| 6 | 0 | 1 | X | X |
| 7 | 1 | 1 | X | X |
| 8 | 0 | 1 | 1 | X |
| 9 | 1 | 1 | 1 | X |
| 10 | 0 | 0 | X | X |
| 11 | 1 | 0 | X | X |
| 12 | 0 | 1 | X | X |
| 13 | 1 | 1 | X | X |
| 14 | 0 | 1 | X | X |
| 15 | 1 | 1 | X | X |
| 16 | 0 | 1 | X | X |
| 17 | 1 | 1 | X | X |
| 18 | 0 | 1 | X | H |
| 19 | 1 | 1 | X | X |
| 20 | 0 | 1 | X | X |
| 21 | 1 | 1 | X | X |

FIG.23

| Time | CLK | NT | SI2 | SI1 | SO1 | SO2 |
|------|-----|----|----|----|----|----|
| 0 | 0 | 1 | X | X | X | X |
| 1 | 1 | 1 | X | X | X | X |
| 2 | 0 | 1 | X | X | X | X |
| 3 | 1 | 1 | X | X | X | X |
| 4 | 0 | 1 | X | 0 | X | X |
| 5 | 1 | 1 | X | 0 | X | X |
| 6 | 0 | 1 | X | X | X | X |
| 7 | 1 | 1 | X | X | X | X |
| 8 | 0 | 1 | 1 | 1 | X | X |
| 9 | 1 | 1 | 1 | 1 | X | X |
| 10 | 0 | 0 | X | X | X | X |
| 11 | 1 | 0 | X | X | X | X |
| 12 | 0 | 1 | X | X | X | X |
| 13 | 1 | 1 | X | X | X | X |
| 14 | 0 | 1 | X | X | H | X |
| 15 | 1 | 1 | X | X | X | X |
| 16 | 0 | 1 | X | X | X | X |
| 17 | 1 | 1 | X | X | X | X |
| 18 | 0 | 1 | X | X | H | X |
| 19 | 1 | 1 | X | X | X | X |
| 20 | 0 | 1 | X | X | X | X |
| 21 | 1 | 1 | X | X | X | X |

FIG. 26
PRIOR ART

| TIME | CLK | NT | SI | SO |
|------|-----|----|----|-----|
| 0    | 0   | 1  | X  | X  |
| 1    | 1   | 1  | X  | X  |
| 2    | 0   | 1  | 1  | X  |
| 3    | 1   | 1  | 1  | X  |
| 4    | 0   | 1  | 0  | X  |
| 5    | 1   | 1  | 0  | X  |
| 6    | 0   | 0  | X  | X  |
| 7    | 1   | 0  | X  | X  |
| 8    | 0   | 1  | X  | L  |
| 9    | 1   | 1  | X  | X  |
| 10   | 0   | 1  | X  | X  |
| 11   | 1   | 1  | X  | X  |
| 12   | 0   | 1  | X  | X  |
| 13   | 1   | 1  | X  | X  |

METHOD FOR GENERATING TEST SEQUENCES FOR DETECTING FAULTS IN TARGET SCAN LOGICAL BLOCKS

BACKGROUND OF THE INVENTION

This invention pertains to a semiconductor integrated circuit (SIC) with scan chains and to a method of generating a testing sequence for fault detection in an SIC.

Conventionally, scan chains formed of scan flip-flops have been used for in-SIC fault detection.

A conventional way of testing a semiconductor integrated circuit for the presence or absence of a fault by means of a scan chain is explained below.

Referring now to FIG. 25, there is shown an SIC 50 with scan chains. 51, 52, and 53 are scan flip-flops. 54 is an AND gate.

Each flip-fop 51, 52, 53 operates as a usual flip-flop when PIN NT is in the state of logical 0 and takes in the state of PIN D as an internal-state on the rising edge of the clock applied to PIN CLK, which is called NORMAL MODE. When PIN NT is in the state of logical 1, on the other hand, each flip-flop 51, 52, 58 takes in the state of PIN DT as an internal state on the rising edge of the clock applied to PIN CLK, which is called SCAN MODE.

PIN DT of the flip-flop 51 is connected to SCAN-IN PIN SI. PIN DT of the flip-flop 52 is connected to PIN Q of the flip-flip 51. PIN DT of the flip-flop 53 is connected to PIN Q of the flip-flop 52. Additionally, PIN Q of the flip-flip 53 is connected to SCAN-OUT PIN SO. That is, in the SCAN MODE, the flip-flops 51, 52, 53 together constitute a shift register with an input terminal (i.e., PIN SI) and an output terminal (i.e., PIN SO). This is called a scan chain.

The shift operation of such a scan chain enables the state of the scan flip-flop to be set as well as to be observed with ease. This facilitates in-SIC fault detection.

A testing sequence for use in in-SIC fault detection is described taking a circuit of FIG. 25 for example.

In order to check SIGNAL LINE A for the presence or absence of a stuck-at-1 fault, it is sufficient to observe the state of SIGNAL LINE Y at the time when SIGNAL LINE A is set at a logical-0 state and SIGNAL LINE B is set at a logical-1 state. If SIGNAL LINE Y is found having a logical-0 state, this indicates that SIGNAL LINE A is good. On the other hand, if SIGNAL LINE Y is found having-a logical-1 state, this indicates that SIGNAL LINE A is in the state of stuck-at-1 fault.

The states of SIGNAL LINES A and B can be set easily making use of scan chains. More specifically, PIN NT is made to have a logical-1 state, whereupon the flip-flops 51, 52, 53 enter the SCAN MODE. A logical-1 and then a logical 0 are taken in at PIN SI to perform shift operations. Thereafter, the flip-flop 52 takes in a logical 1 while the flip-flop 51 takes in a logical 0.

The state of SIGNAL LINE Y can be observed with ease making use of scan chains. More specifically, PIN NT is made to have a logical-0 state, whereupon the flip-flops 51, 52, 53 enter the NORMAL MODE. Normal operations are performed for one clock so as to have the flip-flop 53 take in the state of SIGNAL LINE Y from PIN D. Thereafter, the state of PIN NT is brought to a logical-1 state, whereupon the flip-flops 51, 52, 53 enter the SCAN MODE and shift operations cause PIN SO to provide the state of SIGNAL LINE Y.

FIG. 26 is a table showing data of individual input/output pins of the SIC 50 at the time when performing the above-described operations. "0s" are logical-0 inputs, "1s" are logical-1 inputs, "Ls" indicate that an expected value as output is logical 0, and "Xs" mean "Don't Care".

Shift-in operations are performed in the SCAN MODE (NT=1) at times t0–t5. At t0 and t1, values to be set to the flip-flop 53 are taken in at PIN SI. There is no need for the flip-flop 53 to be set at a specific logical state and the input is "Don't Care". At t2 and t3, a value is taken in at PIN S1 for setting to the flip-flop 52. The flip-flop 52 is to be set at a logical-1 state and the input is a logical 1. At t4 and t5, a value is taken in at PIN S1 for setting to the flip-flop 51. The flip-flop 51 is to be set at a logical 0 state and the input is a logical 0. The shift-in operations are completed here.

At t6 and t7, the flip-flop 53 takes in the state of SIGNAL LINE Y in the NORMAL MODE (NT=0).

Shift-out operations are performed in the SCAN MODE (NT=1) at t8 to t13. At t8 and t9, an expected value held in the flip-flop 53 is provided at PIN SO. If the expected value is logical 0, then the signal line is judged to be good. On the other hand, if the expected value is logical 1, then the signal line is judged to suffer from a fault. At t10 and t11, values held in the flip-flop 52 are provided at PIN SO. At t12 and t13, values held in the flip-flip 51 are provided at PIN SO. The shift-out operations are completed here.

Data patterns, shown in FIG. 26, are called a testing sequence. Data are shifted one position on the rising edge of the clock and two rows of a testing sequence correspond to one shift pattern. Various methods of generating testing sequences for use in in-SIC fault detection have been proposed.

The prior art techniques, however, have disadvantages as follows.

Conventionally, generation of testing sequences is performed on an entire SIC. In other words, testing sequence generation for performing a series of operations on an entire SIC (e.g., inputting data at an input pin, shifting input data into a scan chain, shifting data for comparison with an expected value out of a scan chain, and providing data at an output pin) is performed. This may not produce serious problems as long as the scale of SIC is small. However, in recent years, as integration technology advances the scale of SIC increases. As a result, testing sequence generation becomes a time consuming process. Recently, testing sequences are generated automatically with the aid of computers; however, because of remarkable improvement in the degree of integration, the prior art testing sequence generation techniques require not only a tremendous length of time for generation of testing sequences but also a tremendous amount of memory storage for compaction of the length of testing sequences.

SUMMARY OF THE INVENTION

Bearing in mind the above-noted problems with the prior art technique, this invention was made. Therefore, the present invention shows a technique capable of facilitating the generation of testing sequences and the compaction of the length of testing sequences.

The present invention is intended for a semiconductor integrated circuit having a scan logical block that communicates with a logic block through a scan flip-flop. A block testing sequence, which is a testing sequence for fault detection in the scan logical block as a single circuit, is generated. Thereafter, this generated block testing sequence is related with data of the input/output pins of the semiconductor integrated circuit, to generate a testing sequence.

The present invention provides a semiconductor integrated circuit with external pins. This SIC comprises:

(a) a plurality of logical blocks;

(b) one or more scan chains with an input and an output;
said scan chain being formed of one or more scan flip-flops that are connected in series;
said input and output being connected to said external pins of said semiconductor integrated circuit, respectively;
wherein:
at least one of said plurality of logical blocks is a scan logical block;
said scan logical block having a plurality of scan flip-flops comprising at least one scan flip-flop for receiving a signal from a logical block of said plurality of logical blocks and at least one scan flip-flop for providing a signal to a logical block of said plurality of logical blocks;
said plurality of scan Flip-flops each belong to any one of said scan chains.

As a result of such arrangement, both the first and second scan flip-flop groups become controllable and observable by scan chain shift operations. This achieves individual fault detection.

The present invention shows a method of generating testing sequences for fault detection in a target scan logical block contained in the above-described semiconductor integrated circuit. This method comprises the steps of:

(a) generating a block testing sequence that is a testing sequence for fault detection in a target scan logical block as a single circuit;

(b) converting said generated block testing sequence into a testing sequence intended for the entire semiconductor integrated circuit.

As a result of such arrangement, it is sufficient to generate a block testing sequence to a scan logical block, to cope with an increase in the scale of SIC. This eliminates the previously noted problems with the prior art techniques.

BRIEF DESCRIPTION OF THE DRAWINGS

FIG. 3 shows a testing sequence produced by STEP S11 of FIG. 2.

FIG. 4 shows a testing sequence produced by STEP S12 of FIG. 2.

FIG. 5 shows a testing sequence produced in accordance with the first embodiment of the present invention.

FIG. 8 shows a testing sequence produced by STEP S22 of FIG. 7.

FIG. 9 shows a testing sequence produced by STEP S23 of FIG. 7.

FIG. 10 shows a testing sequence produced in accordance with the second embodiment of the present invention.

FIG. 14 shows a testing sequence produced by STEP S31 of FIG. 13.

FIG. 15 shows a testing sequence produced by STEP S32 of FIG. 13.

FIG. 16 shows a testing sequence produced by STEP S33 of FIG. 13.

FIG. 17 shows a testing sequence produced by STEP S34 of FIG. 13.

FIG. 18 shows a testing sequence produced by STEP S35 of FIG. 13.

FIG. 19 shows a testing sequence produced by STEP S31.

FIG. 20 shows a testing sequence produced by STEP S33.

FIG. 21 shows a testing sequence produced by STEP S34.

FIG. 22 shows a testing sequence produced by STEP S35.

FIG. 23 shows a testing sequence produced in accordance with of the third embodiment of the present invention.

FIG. 26 shows a testing sequence example.

DETAILED DESCRIPTION OF THE INVENTION

Preferred embodiments of this invention are described by reference to the accompanying drawing figures.

EMBODIMENT 1

Figure 1:
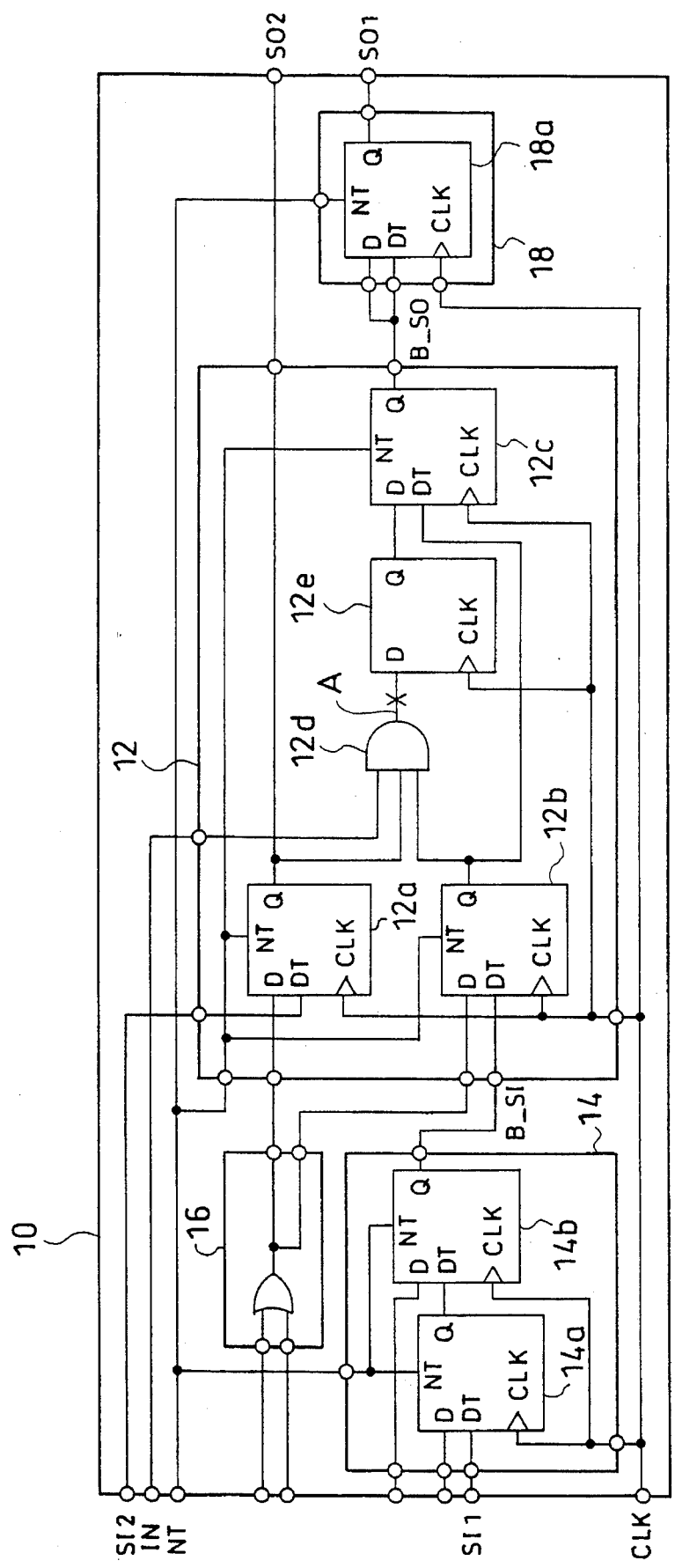
FIG. 1 illustrates a semiconductor integrated circuit in accordance with a first embodiment of the present invention.

Referring first to FIG. 1, there is shown a semiconductor integrated circuit 10 in accordance with a first embodiment of the present invention. The SIC 10 has four logical blocks 12, 14, 16, and 18. The logical block 12 has three scan flip-flops 12a–12c, a NAND gate 12d, and a D-type flip-flop 12e. The logical block 14 has two scan flip-flops 14a and 14b. The logical block 18 has a scan flip-flop 18a. The five flip-flops 14a, 14b, 12b, 12c, and 18a together form a first scan chain. The flip-flip 12a forms a second scan chain.

The logical block 12 receives signals from the logical blocks 14 and 18 at the flip-flops 12a and 12b, and provides signals to the logical block 18 at the flip-flop 12c. In the present embodiment, a logical block which receives a signal from another logical block at a scan flip-flop and which provides a signal to another logical block at a scan flip-flop is called a scan logical block (SLB). The block 12 is an SLB. Additionally, a scan chain formed within an SLB is called a subscan chain. Within the SLB 12, the flip-flops 12b and 12c together form a first subscan chain while on the other hand the flip-flop 12a forms a second subscan chain. The input of the first subscan chain is connected to first SCAN-IN PIN SI1 through BLOCK SCAN-IN PIN B_SI and the flip-flops 14b, 14a of the block 14. On the other hand, the output of the first subscan chain is connected to first SCAN-OUT PIN SO1 through BLOCK SCAN-OUT PIN B_SO and the flip-flop 18a of the block 18. The input of the second subscan chain is direct-connected to second SCAN-IN PIN SI2 and the output thereof is direct-connected to second SCAN-OUT PIN SO2.

Figure 2:
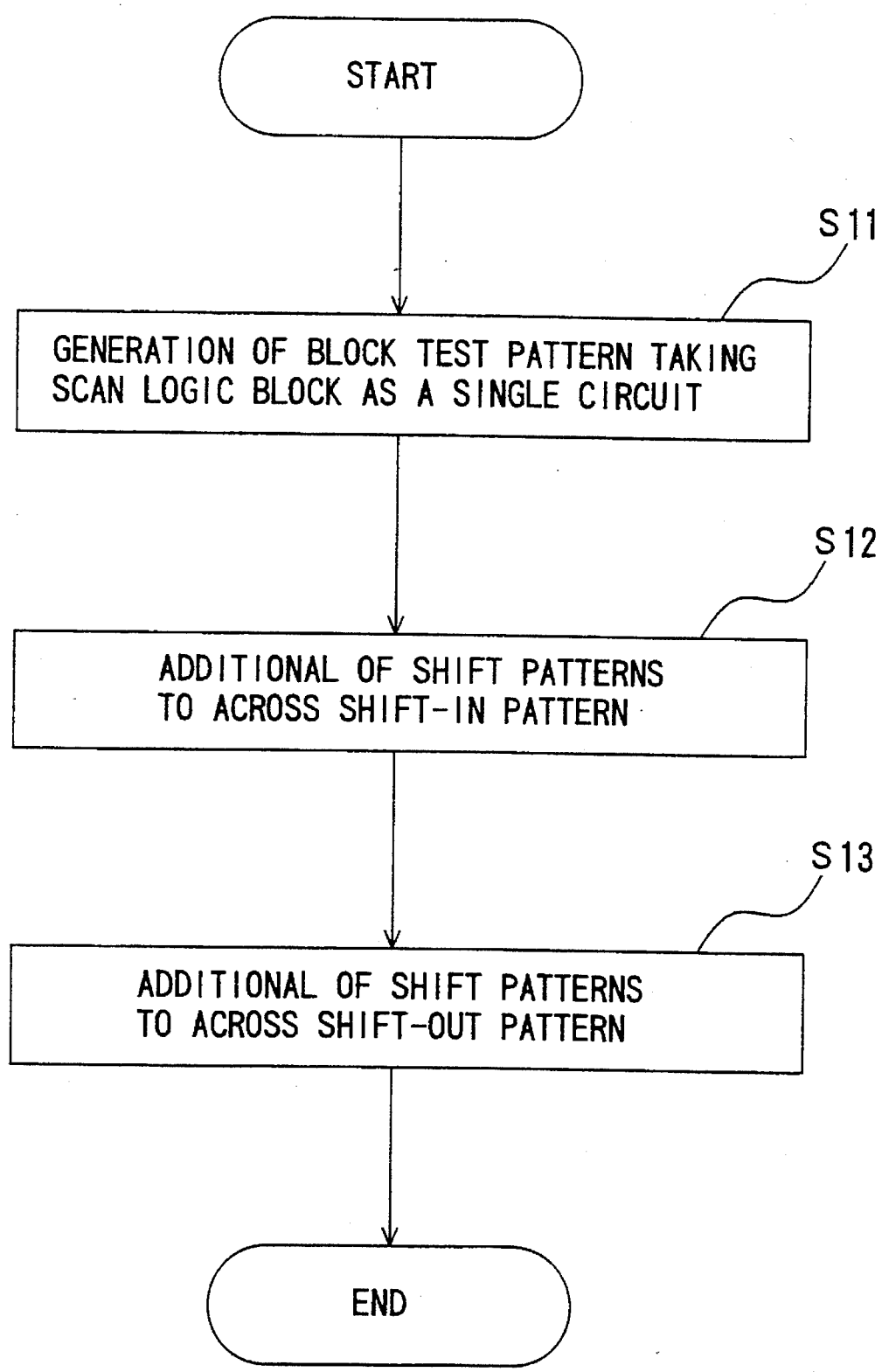
FIG. 2 is a flowchart illustrating a method of generating testing sequences in accordance with the first embodiment of the present invention.

FIG. 2 is a flowchart showing a method of generating testing sequences in accordance with the first embodiment of the present invention.

STEP S11 is a process for generating a block testing sequence (i.e., a testing sequence) to a scan logical block as a single circuit.

STEP S12 is a process for placing a shift pattern (i.e., a pattern for scan flip-flop shift) in front of and behind a pattern in the block testing sequence generated by STEP S11 for shifting input data into the scan logical block, for correspondence to the actual circuit.

STEP S13 is a process for placing a shift pattern in front of and behind a pattern in the block testing sequence generated by STEP S11 for shifting output data out of the scan logical block, for correspondence to the actual circuit.

The present embodiment is explained through an example in which a testing sequence for checking SIGNAL LINE A of the SLB 12 for the presence or absence of a stuck-at-0 fault is generated in accordance with the FIG. 2 method.

Here, M is a number representing the maximum of the numbers of scan flip-flops contained in individual scan chains that run through a target SLB (the block 12 in the present embodiment) subject to stuck-at-0 fault detection, and S is a number representing the maximum of the numbers of in-block scan flip-flops that the individual scan chains running through the target SLB contain within the target SLB. That is, in the SIC 10 of FIG. 1, the first scan chain has five scan flip-flops while the second scan chain has one scan flip-flop. Therefore, M=5. In the SLB 12, the first scan chain has two in-block scan flip-flops while the second scan chain has one in-block scan flip-flop. Therefore, S=2.

The first scan chain has two scan flip-flops on the input side of the SLB 12 (i.e, the flip-flops 14a and 14b) and one scan flip-flop on the output side of the SLB 12 (i.e., the flip-flop 18a). On the other hand, the second scan chain has no flip-flops on the input and output sides of the SLB 12.

FIG. 3 shows a block testing sequence produced by STEP S11. CLK, NT, IN, SI2, and SO2 are data of external pins of the SIC 10. B_SI and B_SO are data of pins of the SLB 12 that is a target scan logical block. "0s" are logical-0 inputs, "1s" are logical-1 inputs, "Hs" indicate that an expected value as output is logical 1, and "Xs" indicate "Don't Care" Data is shifted one position on the rising edge of the clock. Therefore, two rows of a testing sequence correspond to one shift pattern.

At times t0–t3, input data is shifted into each subscan chain of the SLB 12 in the SCAN MODE (NT=1). At t4–t7, data on SIGNAL LINE A is fed to the flip-flop 12c in the NORMAL MODE (NT=0). At t8–t11, data for comparison with the expected value is shifted out of each subscan chain of the SLB 12 in the SCAN MODE (NT=1).

At STEP S12, a shift pattern is placed in front of and behind a shift-in pattern in the FIG. 3 testing sequence.

At STEP S13, a shift pattern is placed in front of and behind a shift-out pattern in the FIG. 4 testing sequence.

More specifically, the following processing is performed on each scan chain formed of subscan chains, the processing including (a) performing a subtraction operation of subtracting a sum of the number of scan flip-flops that a scan chain has on the input side of the SLB 12 and S from M and (b) placing shift patterns equal in number to the result found in front of a pattern for shifting input data into a subscan chain of the scan chain. Since M=5 and S=2, one shift pattern (5–2–2=1) is placed in front of a pattern for shifting input data into the first subscan chain and three shift patterns (5–2–0=3) are placed in front of a pattern for shifting input data into the second subscan chain.

Additionally, shift patterns equal in number to the number of scan flip-flops that a scan chain formed of subscan chains has on the input side of the SLB 12 are placed behind a pattern for shifting input data to a subscan chain of the scan chain. Whereas two shift patterns are placed behind a pattern for shifting input data into the first subscan chain, no one shift pattern is placed behind a pattern for shifting input data into the second subscan chain. FIG. 4 shows a testing sequence produced by STEP S12.

More specifically, the following processing is performed. Shift patterns equal in number to the number of scan flip-flops that a scan chain formed of subscan chains has on the output side of the SLB 12 are placed in front of a pattern for shifting output data out of a subscan chain of the scan chain. One shift pattern is placed behind a pattern for shifting output data out of the first subscan chain. No one shift pattern is placed behind a pattern for shifting output data out of the second subscan chain.

The following processing is performed on each scan chain formed of subscan chains, the processing including (a) performing a subtraction operation of subtracting a sum of the number of scan flip-flops that a scan chain has on the output side of the SLB 12 and S from M and (b) placing shift patterns equal in number to the result found behind a pattern for shifting output data out of a subscan chain of the scan chain. Since M=5 and S=2, two shift-patterns (5–2–1=2) are placed behind a pattern for shifting output data out of the first subscan chain and three shift patterns (5–2–0=3) are placed behind a pattern for shifting output data out of the second subscan chain. STEP S13 produces a testing sequence as shown in FIG. 5. B_SI is changed to SI and B_SO is changed to SO, whereupon the FIG. 5 testing sequence is changed to a testing sequence for the entire SIC 10.

As described above, in the present embodiment, a block testing sequence, which is a testing sequence to a scan logical block as a single circuit, is generated. Thereafter, shift patterns equal in number to the result found by the foregoing operation are placed in front of and behind a shift-in (shift-out) pattern. In accordance with the present invention, a testing sequence for an entire semiconductor integrated circuit can be generated more easily in comparison with a prior art technique.

In accordance with the present embodiment, the number of clocks required for shift-in operations is equal to the number of clocks required for shift-out operations. When continuously generating a testing sequence so as to detect a plurality of faults, it is possible to merge a shift-out pattern in a testing sequence and a shift-in pattern in the next testing sequence. This facilitates generation of shorter testing sequences.

EMBODIMENT 2

Figure 6:
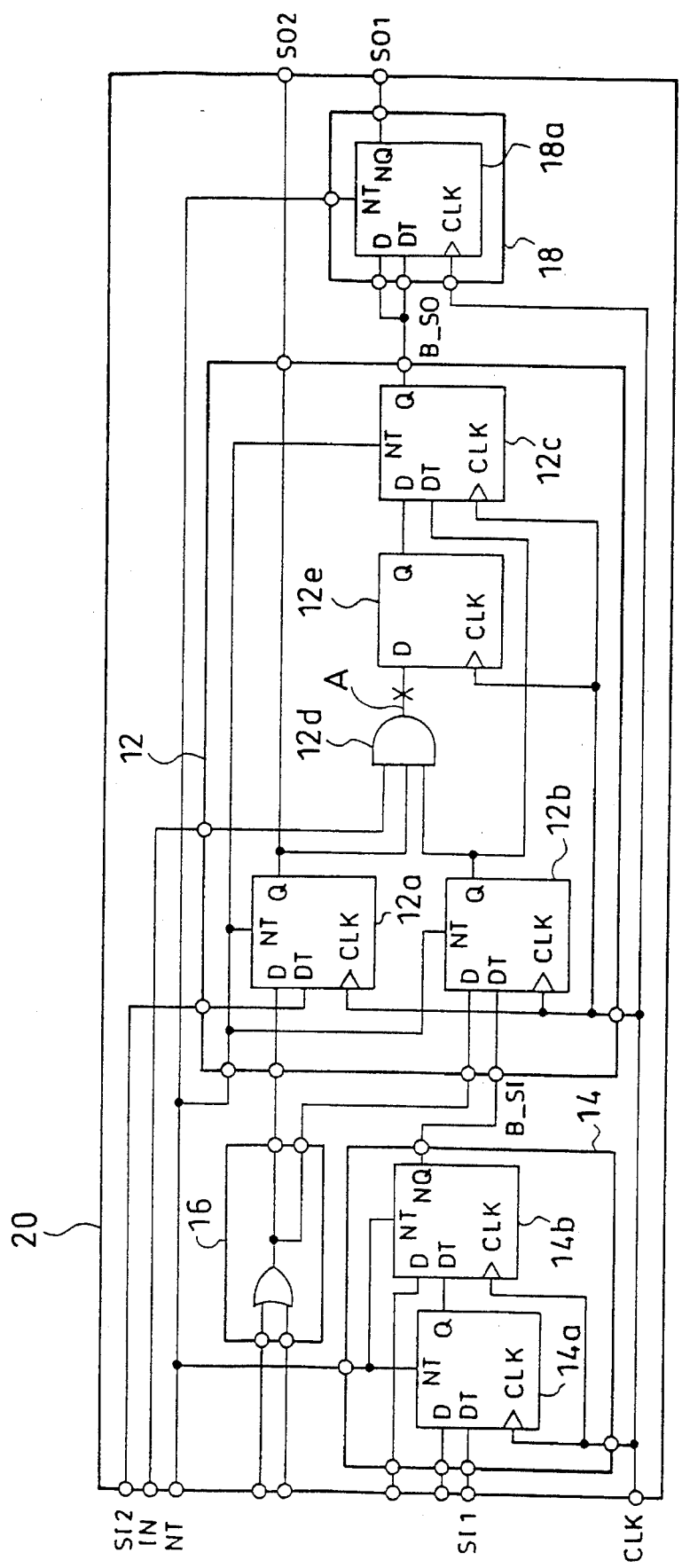
FIG. 6 illustrates a semiconductor integrated circuit in accordance with a second embodiment of the present invention.

FIG. 6 shows a semiconductor integrated circuit 20 in accordance with a second embodiment of this invention. The SIC 10 of FIG. 1 and the SIC 20 of FIG. 6 are alike with the exception that in the SIC 20 the output of the scan flip-flop 14b is inverted (NQ) and the output of the scan flip-flop 18b is inverted (NQ). Like elements are indicated by like reference numerals, accordingly.

Figure 7:
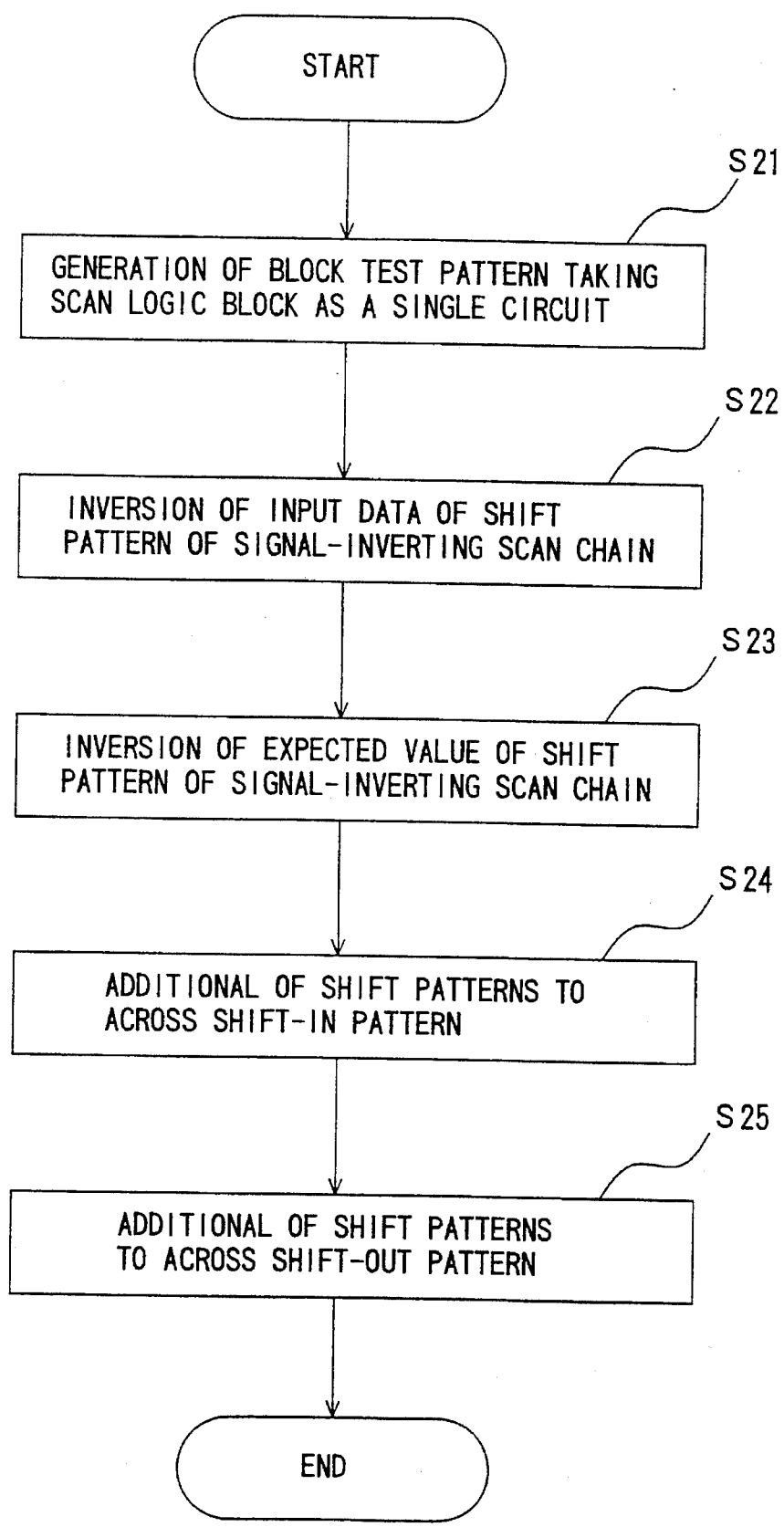
FIG. 7 is a flowchart illustrating a method of generating testing sequences in accordance with the second embodiment of the present invention.

FIG. 7 is a flowchart illustrating a method of generating testing sequences in accordance with the second embodiment. STEPS S21, S24, and S25 of FIG. 7 correspond to STEPS S11, S12, and S13 of FIG. 2, respectively.

At STEP S23, when signal inversion occurs in a scan chain of all scan chains that run through a scan logical block while input data travels from an external pin of the SIC 20 to an input pin of the scan logical block through the scan chain in question, input data in a shift-in pattern is inverted.

At STEP S24, when signal inversion occurs in a scan chain of all scan chains that run through a scan logical block while data for comparison with an expected value travels from an output pin of the scan logical block to an external pin of the SIC 20 through the scan chain in question, data for comparison with an expected value in a shift-out pattern is inverted.

The present embodiment is explained through an example in which a testing sequence for checking SIGNAL LINE A for the presence or absence of a stuck-at-0 fault is generated in accordance with the FIG. 7 method.

Like the first embodiment, STEP S21 generates a block testing sequence (see FIG. 3).

At STEP S22, the FIG. 3 block testing sequence is converted into a block testing sequence of FIG. 8. Since the output of the flip-flop 14b which is a part of the first scan chain and which is arranged on the input side of the SLB 12 is inverted, the input of PIN B_SI at t2 and t3 are converted from logical 1 to logical 0.

At STEP S23, the FIG. 8 block testing sequence is converted into a block testing sequence of FIG. 9. Since the output of the flip-flop 18a which is a part of the first scan chain and which is arranged on the output side of the SLB 12 is inverted, the data of PIN B_SI at t8 (i.e., data for comparison with an expected value) is converted from "H" to "L". "L" indicates that an expected value is "L".

At STEPS S24 and S25, as in the first embodiment, shift patterns are placed in front of and behind a shift-in (shift-out) pattern. As a result, a testing sequence, shown in FIG. 10, is obtained. B_SI is changed to SI and B_SO is changed to SO, whereupon the FIG. 10 testing sequence becomes a testing sequence for the entire SIC 20.

In accordance with the present embodiment, even in the case of a circuit in which signal inversion occurs while input data travels from an external pin of the semiconductor integrated circuit to an input of the scan logical block through the circuit and even in the case of a circuit in which signal inversion occurs while data for comparison with an expected value travels from an output of the scan logical block to an external pin of the semiconductor integrated circuit, generation of testing sequences can be performed per scan logical block.

A scan logical block of the semiconductor integrated circuit of the present invention does not necessarily receive all signals from different logical blocks at its respective scan flip-flops. Additionally, a scan logical block of the semiconductor integrated circuit of the present invention does not necessarily provide all signals to different logical blocks at its respective scan flip-flops.

Figure 11:
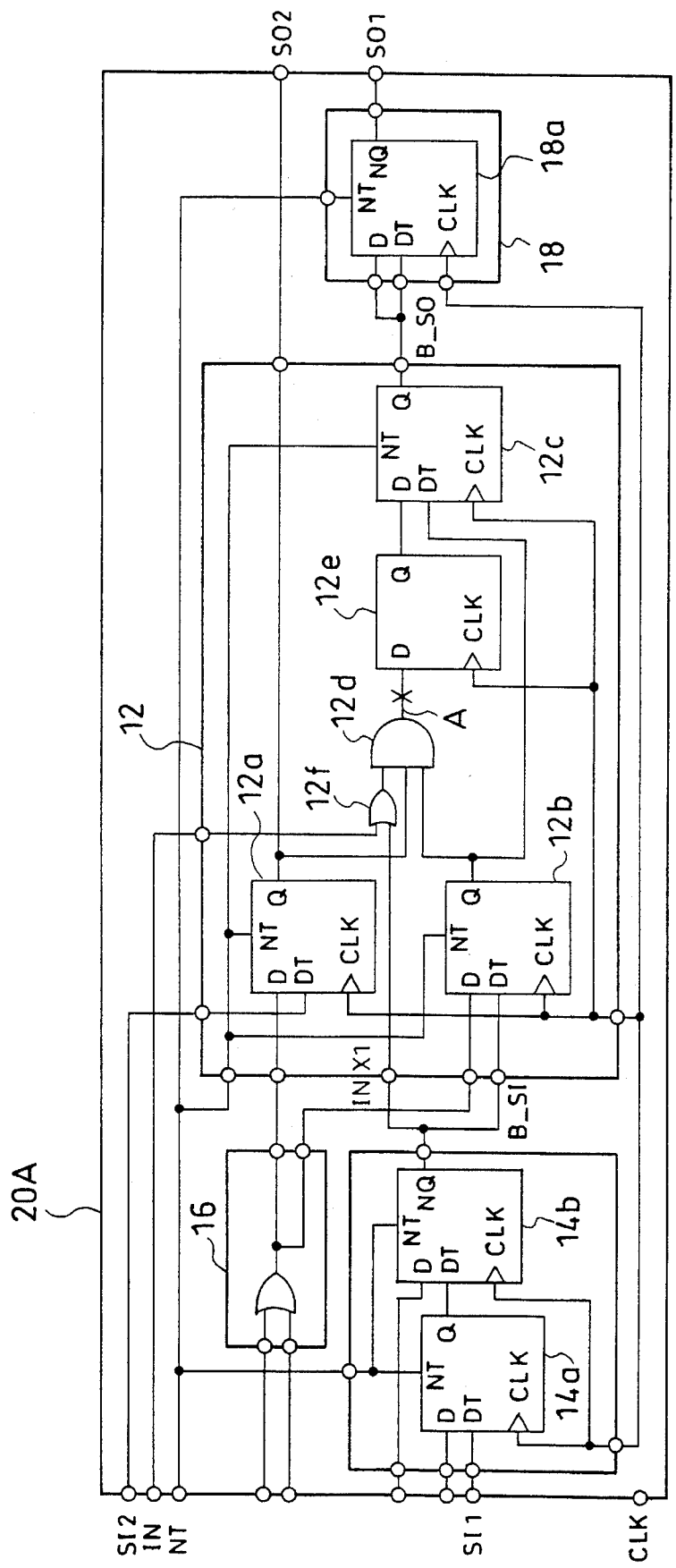
FIG. 11 illustrates another semiconductor integrated circuit in accordance with the second embodiment of the present invention.

FIG. 11 illustrates a semiconductor integrated circuit in accordance with the present embodiment. 20A is a semiconductor integrated circuit. The SIC 20A of FIG. 11 is identical in the structure with the SIC 20 of FIG. 6 with the exception that in the SIC 20A the SLB 12 additionally has PIN INX1 and an OR element 12f and the output of the flip-flop 14b is fed to PIN INX1. Like elements are indicated by like reference numerals.

The scan logical block 12 receives no signals from PIN INZ1, at any one of its scan flip-flops. However, if input from PIN IN is made to be logical 1, then the output of the OR element 12f can be made to logical 1 regardless of the input of PIN INX1 (i.e., "Don't Care"). It is possible for the present embodiment to generate testing sequences in accordance with the same way as applied to the FIG. 6 circuit.

EMBODIMENT 3

A third embodiment of the present invention relates to the generation of testing sequences for fault detection in a plurality of scan logical blocks.

Figure 12:
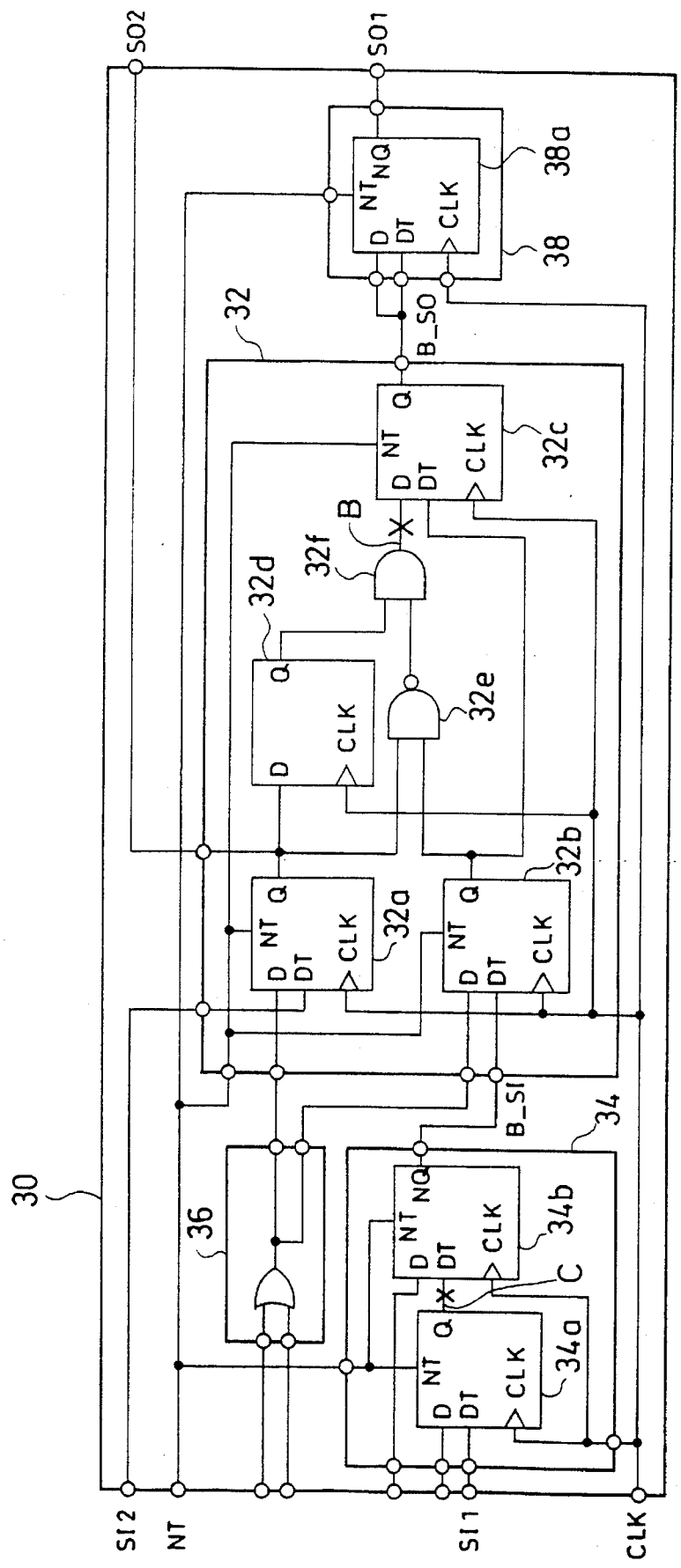
FIG. 12 illustrates a semiconductor integrated circuit in accordance with a third embodiment of the present invention.

FIG. 12 shows a semiconductor integrated circuit 30 in accordance with the third embodiment. The SIC 30 has a first scan logical block 32, a second scan logical block 34, a logical block 36, and a logical block 38. The block 32 has three scan Flip-flops 32a, 32b, 32c, a D-type flip-flop 32d, a NAND gate 32e, and an AND gate 32f. The block 34 has two scan flip-flops 34a and 34b. The block 38 has a scan flip-flop 38a. The five flip-flops 34a, 34b, 32b, 32c, and 38a together form a first scan chain. The flip-flop 32a forms a second scan chain.

The first SLB 32 accepts signals from the blocks 34 and 36 at the flip-flops 32a and 32b and provides signals to the block 38 at the flip-flop 32c. The flip-flops 32b and 32c together form a first subscan chain. The flip-flop 32a forms a second subscan chain. The input of the first subscan chain is connected to PIN SI1 via PIN B_SI and the flip-flops 34a and 34b of the block 34 and the output thereof is connected to PIN SO1 via PIN B_SO and the flip-flop 38a of the block 38. The input of the second subscan chain is direct-connected to PIN SI2 and the output thereof is direct-connected to PIN SO2.

The second SLB 34 receives signals from PIN SI1 at the flip-flop 34a and provides signals to the block 32 at the flip-flop 34b.

Figure 13:
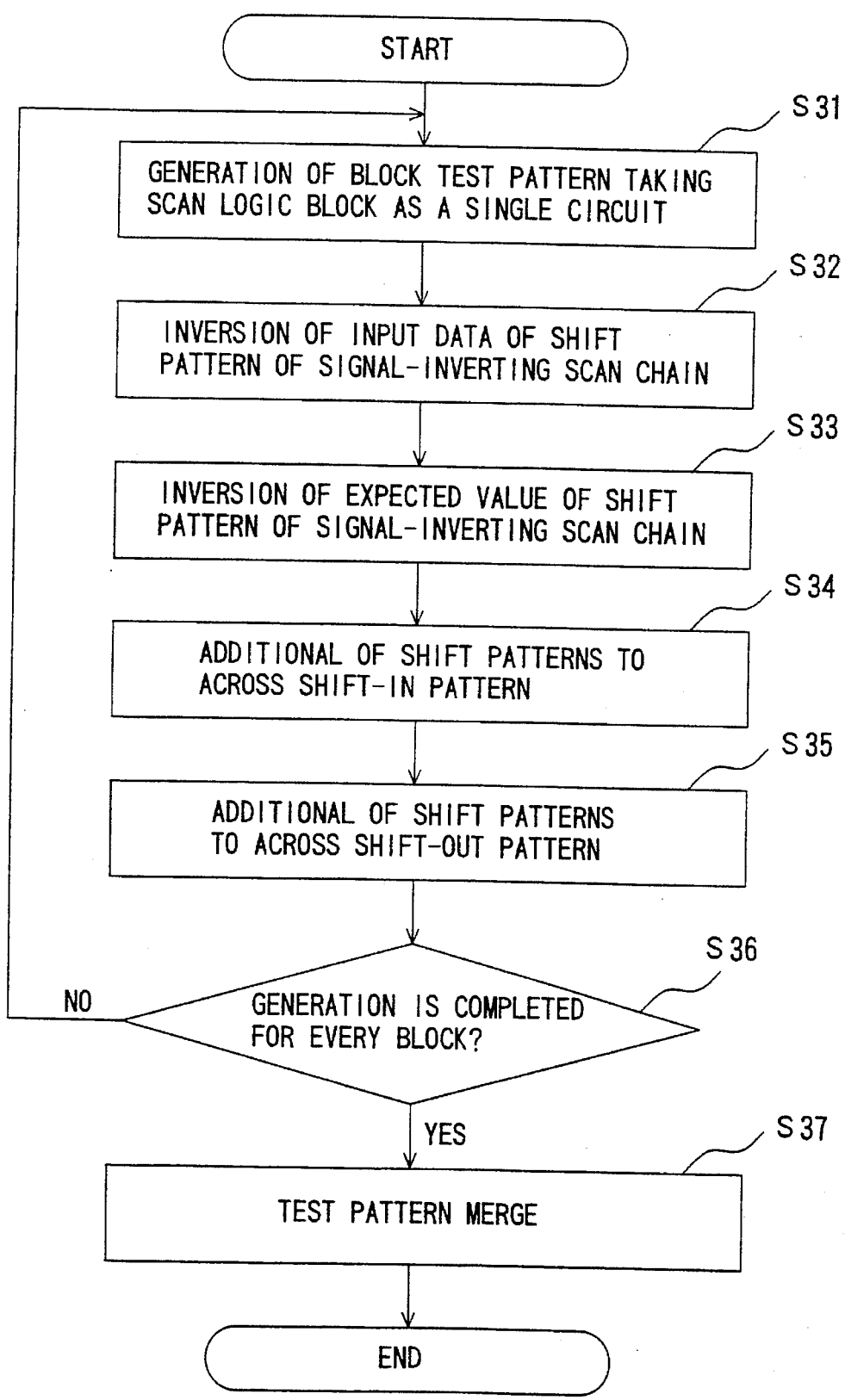
FIG. 13 is a flowchart illustrating a method of generating testing sequences in accordance with the third embodiment of the present invention.

FIG. 13 is a flowchart illustrating a method of generating testing sequences in accordance with the third embodiment. STEP S31 of FIG. 13 and STEP S21 of FIG. 7 are the same. STEP S32 and STEP S22 are the same. STEP S33 and STEP 23 are the same. STEP S34 and STEP S24 are almost the same but they differ from each other in that they employ different ways of finding the number of patterns to be placed. Likewise, STEP S35 and STEP S25 are almost the same but they differ from each other in that they employ different ways of finding the number of patterns to be placed, which is described later.

A series of STEPS S31–S35 is performed per scan logical block. STEP S36 is a step of determining whether testing sequence generation is performed on every scan logical block.

STEP S37 is a step of merging testing sequences generated to the scan logical blocks.

The present embodiment is explained through an example in which a testing sequence for checking SIGNAL LINE B of the first SLB 32 for a stuck-at-0 fault and a testing sequence for checking SIGNAL LINE C of the second SLB 34 for a stuck-at-1 fault are generated in accordance with the FIG. 13 method.

Here, N is a number representing the maximum of the numbers of scan flip-flops contained in individual scan chains that run through any one of target scan logical blocks, and $T_i$ is a number representing the maximum of the numbers of in-block scan flip-flops that all scan chains running through one target scan logical block contain within the target scan logical block, where i indicates the scan logical block number.

More specifically, in the SIC 30 of FIG. 12, the first scan chain contains five scan flip-flops and the second scan chain contains one scan flip-flop. Therefore, N=5. Within the first SLB 32, the first scan chain contains two in-block scan flip-flops and the second scan chain contains one in=block flip-flop. Therefore, $T_1$=2. Only the first scan chain runs through the second SLB 34 and contains two in-block flip-flops. Therefore, $T_2$=2.

A testing sequence is generated to the first SLB 32. The first scan chain, on the one hand, has two flip-flops (34a, 34b) on the input side of the first SLB 32 and one flip-flop (38a) on the output side of the first SLB 32. On the other hand, the second scan chain has no scan flip-flops on the input and output sides of the first SLB 32.

At STEP S31, a block testing sequence as shown in FIG. 14 is obtained, with the flip-flop 32d acting as a black box. CLK, NT, SI2, and SO2 are data of the external pins of the SIC 30. B_SI and B_SO are data of the pins of the first SLB 32.

Since the output of the flip-flop 34d is inverted, the FIG. 14 block testing sequence is converted into a block testing sequence as shown in FIG. 15 at STEP S32. Likewise, since the output of the flip-flop 38a is inverted, the FIG. 15 block testing sequence is converted into a block testing sequence as shown in FIG. 16 at STEP S33.

At STEP S34, in the FIG. 16 testing sequence, a shift pattern is placed in front of and behind a shift-in pattern.

The following processing is carried out on each scan chain formed of subscan chains, the processing including (a) performing a subtraction operation of subtracting a sum of the number of scan flip-flops that a scan chain has on the input side of the first SLB 32 and $T_1$ from N and (b) placing shift patterns equal in number to the result found in front of a pattern for shifting input data into a subscan chain of the scan chain. Since N=5 and $T_1$=2, (i) one shift pattern (5–2–2=1) is placed in front of a pattern for shifting input data into the first subscan chain and (ii) three shift patterns (5–2–0=3) are placed in front of a pattern for shifting input data into the second subscan chain.

Additionally, shift patterns equal in number to the number of scan flip-flops that a scan chain contains on the block's 32 input side are placed behind a pattern for shifting input data into a subscan chain of the scan chain. Two shift patterns are placed behind a pattern for shifting input data into the first subscan chain. No one shift pattern is placed behind a pattern for shifting input data into the second subscan chain. STEP S34 is performed to obtain a testing sequence as shown in FIG. 17.

Next, at STEP S35, in the FIG. 17 testing sequence, a shift pattern is placed in front of and behind a shift-out pattern.

More specifically, the following processing is performed. Shift patterns equal in number to 'the number of scan flip-flops that a scan chain has on the first SLB's 32 output side are placed in Front of a pattern for shifting output data out of a subscan chain of the scan chain. One shift pattern is placed in front of a pattern for shifting output data out of the first subscan chain. No one shift pattern is placed in front of a pattern for shifting output data out of the second subscan chain.

For every scan chain formed of subscan chains, the following processing is performed, the processing including (a) performing a subtraction operation of subtracting a sum of the number of scan flip-flops that a scan chain has on the output side of the first SLB 32 and $T_1$ from N and (b) placing shift patterns equal in number to the result found behind a pattern for shifting output data out of a subscan chain of the scan chain. Since N=5 and $T_1$=2, (i) two shift pattern (5–2–1=2) are placed behind a pattern for shifting output data out of the first subscan chain and (ii) three shift patterns (5–2–0=3) are placed behind a pattern for shifting output data out of the second subscan chain.

FIG. 18 shows a testing sequence as a result of completion of STEP S35. B_SI is changed to SI1 and B_SO is changed to SO1, as result of which the FIG. 18 testing sequence becomes a testing sequence for the entire SIC STEP S36 is a step of determining whether testing sequence generation to every scan logical block is completed. Since testing sequence generation to the second SLB 34 has not been completed, the processing returns to STEP S31.

Testing sequence generation is performed on the second SLB 34. Only the first scan chain runs through the second SLB 34. The number of scan flip-flops that the first scan chain has on the second SLB's 34 input side is zero and the number of scan flip-flops that the first scan chain has on the second SLB's 34 output side is three.

FIG. 19 shows a block testing sequence as a result of completion of STEP S31. CLK, NT, and SI1 are data of external pins of the SIC 30. B_SI is data of a pin of the first SLB 32.

In the first scan chain, no signal inversion occurs on the second SLB's 34 input side and STEP S33 is skipped. Since the output of the flip-flop 38a is inverted, the FIG. 19 block testing sequence is converted by STEP S33 into a block testing sequence as shown in FIG. 20.

Next, since N=5 and $T_2$=2, three shift patterns are placed in front of a pattern for shifting input data into the first scan chain and no one shift pattern is placed behind the pattern at STEP S34. FIG. 21 shows a testing sequence as a result of completion of STEP S34.

At STEP S35, three shift patterns are placed in front of a pattern for shifting output data out of the first scan chain and no one shift pattern is placed behind the pattern.

FIG. 22 shows a testing sequence as a result of completion of STEP S35. B_SI is changed to SO1, whereupon the FIG. 22 testing sequence becomes a testing sequence for the entire SIC 30.

STEP S36 makes a judgement that testing sequence generation is performed on all the scan logical blocks. The processing proceeds to STEP S37.

At STEP S37, the testing sequence generated to the first SLB 32 and the testing sequence generated to the second SLB 34 are merged.

In the FIG. 18 testing sequence, B_SI is changed to SI1 and B_SO is changed to SO1. In the FIG. 22 testing sequence, B_SI is changed to SO1. Pin data of the two testing sequences obtained are superimposed in the order of time. If there is a difference between data items, a non-Don't Care data item is selected in preference to the other data item. As a result of this, a testing sequence as shown in FIG. 23 is obtained. The FIG. 23 testing sequence enables SIGNAL LINE B of the first SLB 32 to be checked for the presence or absence of a stuck-at-1 fault and further enables SIGNAL LINE C of the second SLB 34 to be checked for the presence or absence of a stuck-at-0 fault.

As described above, in accordance with the present embodiment, generation of testing sequences is performed on each scan logical block and thereafter the generated testing sequences are merged for compaction.

Additionally, even in the case of a semiconductor integrated circuit that contains (a) a circuit in which signal inversion occurs while input data travels from an external pin of the SIC to an input of a scan logical block through a scan chain or (b) a circuit in which signal inversion occurs while output data travels from an output of a scan logical block to an external pin of the SIC through a scan chain, it is possible to perform generation and compaction of test sequences.

Further, in accordance with the present embodiment, the number of clocks required for shift-in operations is equal to the number of clocks required for shift-out operations. Therefore, when continuously generating a testing sequence so as to detect a plurality of faults, it becomes possible to merge a shift-out pattern in a testing sequence and a shift-in pattern in the next testing sequence. This facilitates generation of shorter testing sequence.

A scan logical block in accordance with the present embodiment does not necessarily receive all signals from other logical blocks at its scan flip-flops. Likewise, a scan logical block in accordance with the present embodiment does not necessarily provide all signals to logical blocks at its scan flip-flops.

Figure 24:
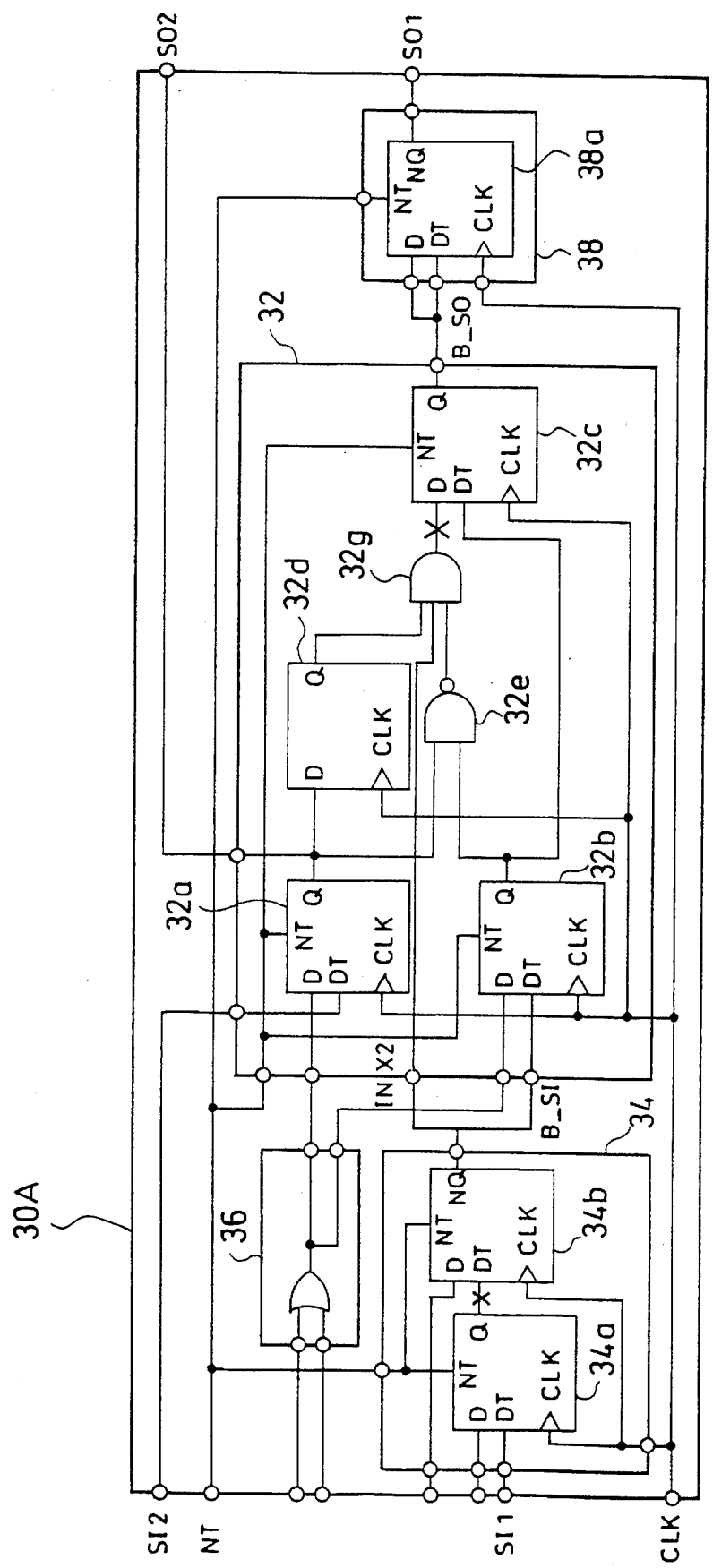
FIG. 24 illustrates another semiconductor integrated circuit in accordance with the third embodiment of the present invention.
Figure 25:
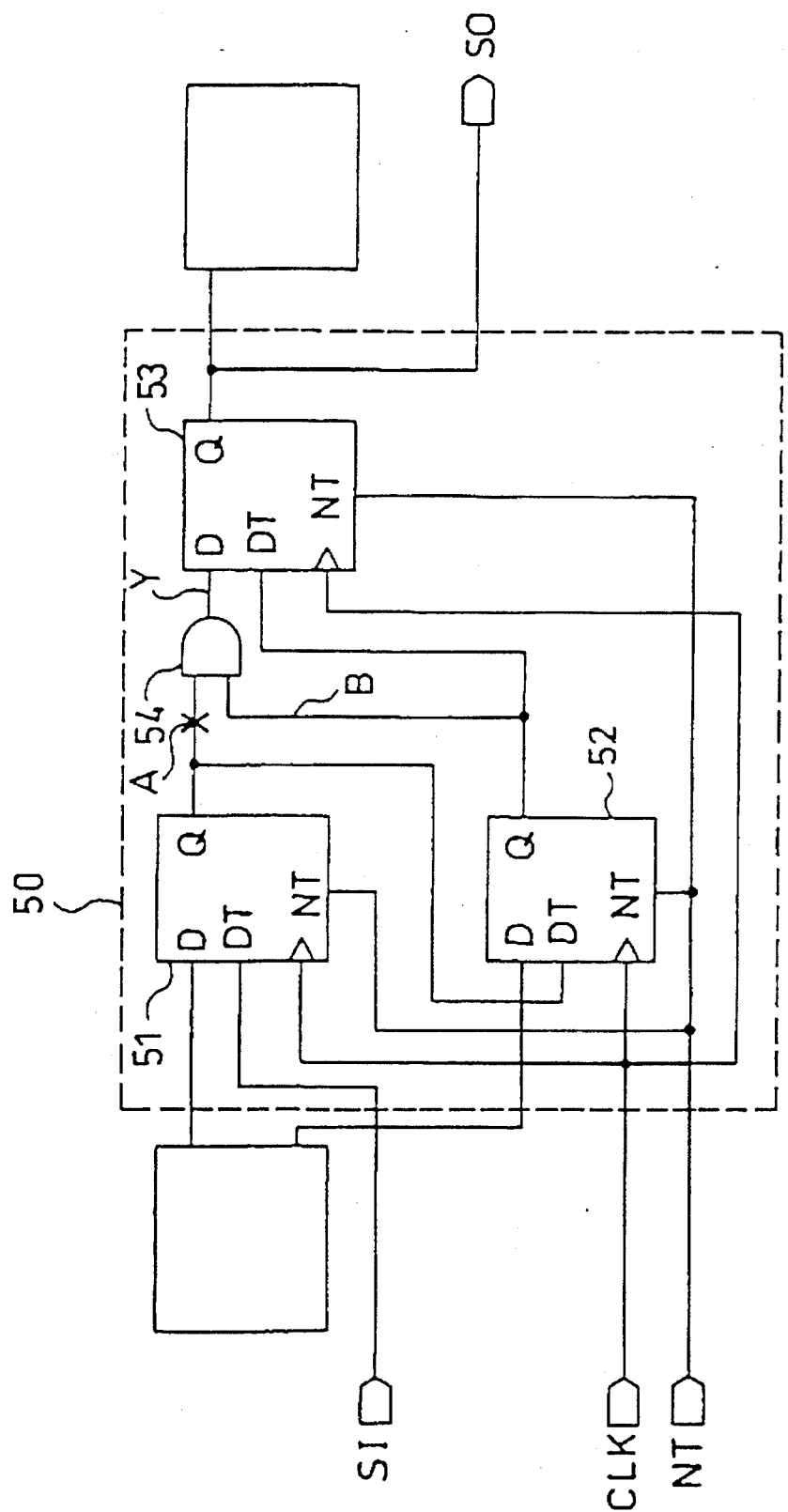
FIG. 25 is a diagram of a semiconductor integrated circuit useful in understanding a conventional method of generating testing sequences.

FIG. 24 shows a semiconductor integrated circuit 30A in accordance with the present embodiment. The SIC 30A and the SIC 30 are identical in the structure with each other, with the exception that in the SIC 30A (i) the 2-input AND gate 32f of the first SLB 32 is replaced with a 3-input AND gate 32g, (ii) PIN INX2 is provided, and (iii) the output of the flip-flop 34b of the second SLB 34 is connected to the input of PIN INX2. Like elements are indicated by like reference numerals.

The first SLB 32 does not receive signals from PIN INX2 at any of its scan flip-flops. However, if the outputs of the flip-flops 32a and 32b are set at logical 1 by shift-in operations, this enables the output of the AND gate 32g to become logical 0 regardless of the input of PIN INX2 (i.e., "Don't Care"). As a result, testing sequences can be generated in the same way as applied to the FIG. 12 circuit.

The invention claimed is:

1. A method of generating testing sequences for fault detection in a semiconductor integrated circuit having external pins, comprising:

(a) a plurality of logical blocks; and
    (b) one or more scan chains with an input and an output;
        said scan chain being formed of one or more scan flip-flops that are connected in series;
        said input and output being connected to said external pins of said semiconductor integrated circuit, respectively;
    wherein;
        at least one of said plurality of logical blocks is a scan logical block;
        said scan logical block having a plurality of scan flip-flops comprising at least one scan flip-flop for receiving a signal from a logical block of said plurality of logical blocks and at least one scan flip-flop for providing a signal to a logical block of said plurality of logical blocks; and
        said plurality of scan flap-flops each belong to any one of said scan chains,
    said method comprising the steps of:
        (a) generating a block testing sequence that is a testing sequence for fault detection in a target scan logical block as a single circuit; and
        (b) converting said generated block testing sequence into a testing sequence intended for the entire semiconductor integrated circuit.

2. A method of generating testing sequences for fault detection in a semiconductor integrated circuit having external pins, comprising:

(a) a plurality of logical blocks; and
    (b) one or more scan chains with an input and an output;
        said scan chain being formed of one or more scan flip-flops that are connected in series;
        said input and output being connected to said external pins of said semiconductor integrated circuit, respectively;
    wherein;
        at least one of said plurality of logical blocks is a scan logical block;
        said scan logical block having a plurality of scan flip-flops comprising at least one scan flip-flop for receiving a signal from a logical block of said plurality of logical blocks and at least one scan flip-flop for providing a signal to a logical block of said plurality of logical blocks; and
        said plurality of scan flip-flops each belong to any one of said scan chains,
    said method comprising the steps of:
        (a) a first step of generating a block testing sequence that is a testing sequence for fault detection in a target scan logical block as a single circuit;
        where (i) M is a number representing the maximum of the numbers of scan flip-flops contained in individual scan chains that run through said target scan logical block and (ii) S is a number representing the maximum of the numbers of in-block scan flip-flops that said individual scan chains contain within said target scan logical block;
        (b) a second step including:
            (b-1) subtracting a sum of the number of scan flip-flops that each said scan chain, has on the input side of said target scan logical block and S from M, and placing a pattern for shifting scan flip-flops equal in number to a result found, in front of a pattern in said block testing sequence for shifting input data into said scan target logical block via each said scan chain; and
            (b-2) finding the number of flip-flops that each said scan chain has on the input side of said target scan logical block, and placing a pattern for shifting scan flip-flops equal in number to a result found, behind a pattern in said block testing sequence for shifting input data into said scan target logical block via each said scan chain; and
        (c) a third step including:
            (c-1) finding the number of flip-flops that each said scan chain has on the output side of said target scan logical block, and placing a pattern for shifting scan flip-flops equal in number to a result found, in front of a pattern in said block testing sequence for shifting data for comparison with an expected value out of said target scan logical block via each said scan chain; and
            (c-2) subtracting a sum of the number of scan flip-flops that each said scan chain has on the output side of said target scan logical block and S from M, and placing a pattern for shifting scan flip-flops equal in number to a result found, behind a pattern in said block testing sequence for shifting data for comparison with an expected value out of said scan target logical block via each said scan chain.

3. A method of generating testing sequences of claim 2 additionally comprising:

where there occurs signal inversion in a scan chain among said scan chains that run through said target scan logical block while input data travels from an external pin of said semiconductor integrated circuit to an input pin of said target scan logical block through said scan chain in question;

(d) a fourth step of inverting input data to said scan chain in said block testing sequence;

where there occurs signal inversion in a scan chain among said scan chains that run through said target scan logical block while data for comparison with an expected value travels from an output pin of said target scan logical block to an external pin of said semiconductor integrated circuit through said scan chain in question;

(e) a fifth step of inverting data for comparison with an expected value to said scan chain in said block testing sequence.

4. A method of generating testing sequences for fault detection in a plurality of target scan logical blocks contained in a semiconductor integrated circuit having with external pins, comprising:

(a) a plurality of logical blocks; and (b) one or more scan chains with an input and an output; said scan chain being formed of one or more scan flip-flops that are connected in series; said input and output being connected to said external pins of said semiconductor integrated circuit, respectively;
wherein;
at least one of said plurality of logical blocks is a scan logical block;
said scan logical block having a plurality of scan flip-flops comprising at least one scan flip-flop for receiving a signal from a logical block of said plurality of logical blocks and at least one scan flip-flop for providing a signal to a logical block of said plurality of logical blocks; and
said plurality of scan flip-flops each belong to any one of said scan chains,
said method comprising the steps of:
(a) a first step including:
(a-1) generating a block testing sequence that is a testing sequence for fault detection in each said target scan logical block as a single circuit;
(a-2) converting said generated block testing sequence into a testing sequence intended for the entire semiconductor integrated circuit, to generate a testing sequence to each said target scan logical block; and
(b) a second step of merging said testing sequences generated in said first step.

5. A method of generating a testing sequence of claim 4 wherein, when a scan logical block of said scan logical blocks has a flip-flop not contained in any scan chain, said first step is performed such that said flip-flop is considered a black box and said scan logical block is assumed to be a full scan circuit.

6. A method of generating testing sequences for fault detection in A target scan logical blocks contained in a semiconductor integrated circuit having external pins where the number A is greater than or equal to two, said circuit comprising:

(a) a plurality of logical blocks; and (b) one or more scan chains with an input and an output; said scan chain being formed of one or more scan flip-flops that are connected in series; said input and output being connected to said external pins of said semiconductor integrated circuit, respectively;
wherein:
at least one of said plurality of logical blocks is a scan logical block;
said scan logical block having a plurality of scan flip-flops comprising at least one scan flip-flop for receiving a signal from a logical block of said plurality of logical blocks and at least one scan flip-flop for providing a signal to a logical block of said plurality of logical blocks; and
said plurality of scan flip-flops each belong to any one of said scan chains,
said method comprising the steps of:
(a) a first step of generating a block testing sequence that is a testing sequence for fault detection in an ith scan logical block of said A scan logical blocks as a single circuit where $1 \leq i \leq A$;
where (i) N is a number representing the maximum of the numbers of scan flip-flops contained in individual scan chains that run through any one of said A scan logical blocks and (ii) $T_i$ is a number representing the maximum of the numbers of in-block scan flip-flops that individual scan chains that run through said ith scan logical block contain within said ith scan logical block;
(b) a second step including:
(b-1) subtracting a sum of the number of scan flip-flops that each said scan chain running through said ith scan logical block has on the input side of said ith scan logical block and $T_i$ from N, and placing a pattern for shifting scan flip-flops equal in number to a result found, in front of a pattern in said block testing sequence for shifting input data into said ith scan logical block via each said scan chain; and
(b-2) finding the number of flip-flops that each said scan chain running through said ith scan logical block has on the input side of said ith scan logical block, and placing a pattern for shifting scan flip-flops equal in number to a result found, behind a pattern in said block testing sequence for shifting input data into said ith scan logical block via each said scan chain;
(c) a third step including:
(c-1) finding the number of flip-flops that each said scan chain running through said ith scan logical block has on output side of said ith scan logical block, and placing a pattern for shifting scan flip-flops equal in number to a result found, in front of a pattern in said block testing sequence for shifting data for comparison with an expected value out of said ith scan logical block via each said scan chain; and
(c-2) subtracting a sum of the number of scan flip-flops that each said scan chain running through said ith scan logical block has on the output side of said ith scan logical block and $T_i$ from N, and placing a pattern for shifting scan flip-flops equal in number to a result found, behind a pattern in said block testing sequence for shifting data for comparison with an expected value out of said ith scan logical block via each said scan chain; and (d) a fourth step including:

(d-1) repeating said first to third steps, to generate testing sequences to said A scan logical blocks, respectively; and (d-2) superimposing said testing sequences in the order of time for merging.

7. A method of generating testing sequences of claim 6 additionally comprising:

where there occurs signal inversion in a scan chain among said scan chains that run through said ith scan logical block while input data travels from an external pin of said semiconductor integrated circuit to an input pin of said ith scan logical block through said scan chain in question;

(e) a fifth step of inverting input data to said scan chain in said block testing sequence generated to said ith scan logical block;

where there occurs signal inversion in a scan chain among said scan chains that run through said ith scan logical block while data for comparison with an expected value travels from an output pin of said ith scan logical block to an external pin of said semiconductor integrated circuit through said scan chain in question;

(f) a sixth step of inverting data for comparison with an expected value to said scan chain in said block testing sequence generated to said ith scan logical block.

* * * * *